United States Patent

Bashir et al.

Patent Number: 5,856,239
Date of Patent: Jan. 5, 1999

[54] TUNGSTEN SILICIDE/ TUNGSTEN POLYCIDE ANISOTROPIC DRY ETCH PROCESS

[75] Inventors: Rashid Bashir, Santa Clara; Abul Ehsanul Kabir; Francois Hebert, both of Sunnyvale, all of Calif.

[73] Assignee: National Semiconductor Corporaton, Santa Clara, Calif.

[21] Appl. No.: 850,573

[22] Filed: May 2, 1997

[51] Int. Cl.$^6$ .................................................... H01L 21/00
[52] U.S. Cl. ........................ 438/738; 216/67; 252/79.1; 438/713; 438/721
[58] Field of Search .................................. 438/712, 713, 438/719, 721, 723, 738, 743; 216/2, 67; 252/79.1

[56] References Cited

U.S. PATENT DOCUMENTS

| | | | |
|---|---|---|---|
| 4,414,057 | 11/1983 | Bourassa et al. | 156/643 |
| 4,443,930 | 4/1984 | Hwang et al. | 29/571 |
| 4,473,436 | 9/1984 | Beinvogl | 156/643 |
| 4,528,066 | 7/1985 | Merkling et al. | 438/721 X |
| 5,169,487 | 12/1992 | Langley et al. | 438/721 X |
| 5,173,151 | 12/1992 | Namose | 156/643 |
| 5,201,993 | 4/1993 | Langley | 156/643 |
| 5,242,538 | 9/1993 | Hamrah et al. | 156/643 |
| 5,423,945 | 6/1995 | Marks et al. | 156/662.1 |

OTHER PUBLICATIONS

T. Maruyama et al., "Mechanism of Reactive Ion Etching Lag in WSi$_2$ Etching Using Electron Cyclotron Resonance Plasma," *Jpn. J. Appl. Phys.*, vol. 33 (1994), pp. 2170–2174, Part 1, No 4B, Apr. 1994.

C. Meiqiao et al., "Fabrication of WSi$_2$ Micron Structures Using RIE in SF$_6$–N$_2$ Mixture," *Chinese Journal of Semiconductors*, vol. 11, No. 5, May 1990, pp. 356–359.

Primary Examiner—William Powell
Attorney, Agent, or Firm—Limbach & Limbach LLP

[57] ABSTRACT

A process for anisotropically etching a tungsten silicide or tungsten polycide structure. If the silicide/polycide film has an overlying oxide layer, the insulating layer is removed by a gas mixture composed of CHF$_3$ and C$_2$F$_6$. The WSi$_x$ silicide layer is then etched in a reactive ion etch using a gas mixture formed from Cl$_2$ and C$_2$F$_6$, with sufficient O$_2$ added to control polymer formation and prevent undercutting of the silicide. The polysilicon layer is then etched using a gas mixture formed from Cl$_2$ and C$_2$F$_6$. The result is a highly anisotropic etch process which preserves the critical dimension of the etched structures. The etch parameters may be varied to produce a tapered sidewall profile for use in the formation of butted contacts without the need for a contact mask.

15 Claims, 1 Drawing Sheet

TUNGSTEN SILICIDE/ TUNGSTEN POLYCIDE ANISOTROPIC DRY ETCH PROCESS

TECHNICAL FIELD

The present invention is directed to dry etch processes, and more specifically, to a method of etching tungsten silicide/polycide films using a highly controllable etch chemistry which can produce either anisotropic or tapered sidewall profiles.

BACKGROUND OF THE INVENTION

High performance CMOS, BiCMOS, bipolar, and complementary BiCMOS process flows often require the dry etching of silicide/polycide films to produce sub-micron low-resistance gate electrodes and local interconnect structures. The etching is required to be highly anisotropic in order to obtain controlled critical dimensions for the devices. For example, the patterning of fine geometry polycide gates for high performance CMOS devices, the formation of narrow local interconnects which are stable at high temperatures, and the formation of fine geometry electrodes for high frequency bipolar devices all require that a "stack" of material layers which include an insulator and a silicide or polycide (silicide plus polysilicon) film be etched. This etching needs to be highly anisotropic to prevent the undercutting of the silicide/polycide film and a resulting loss of critical dimension.

However, most currently available dry etch processes are not sufficiently anisotropic. Lateral etching of the silicide film with respect to the underlying or overlying films occurs, resulting in a loss (reduction) of the critical dimension. In addition, the severe undercut of a silicide film which is covered with an insulator can lead to the formation of non-ideal sidewall spacers which can result in residual metal stringers after a metallization step.

For example, an etch chemistry composed of $Cl_2$ and $CF_4$ has been used to etch a stack consisting, from top to bottom, of a resist layer, an insulator, a silicide film (typically tungsten silicide, $WSi_x$), and polysilicon, all on a silicon substrate. However, this etch chemistry has several disadvantages. It results in excessive undercutting of the silicide layer, which in turn results in non-ideal sidewall spacer formation which causes metal stringers. It also provides poor control of the critical dimension, and in-sufficient lateral diffusion from the silicide layer. This reduces the lateral link between that layer and the remaining portions of the device structure when a polycide stack is used as a contact electrode, as in the case of a double polysilicon self-aligned bipolar device.

For such structures, the $Cl_2$ and $CF_4$ based dry etch has been used to etch a resist, insulator, silicide, polysilicon stack which is arranged so that it is partially over a silicon substrate and partially over an oxide layer which overlays the substrate. In this situation, the endpoint of the etch will be based on the polysilicon-oxide interface. This may lead to over-etching of the silicon substrate in those regions in which the stack is arranged over the substrate. This should be minimized to reduce damage to the active device regions formed in the substrate.

U.S. Pat. No. 4,473,436, issued Sep. 25, 1984, naming Beinvogl as inventor, discloses a method for etching a stack which includes metal silicide and polysilicon films arranged over a silicon substrate. The reactive ion etch described in the '436 patent involves the use of a gas mixture which contains fluorine and chlorine as the reactive etch gas. In the preferred embodiment, a gas mixture containing $SF_6$ and $Cl_2$ is used to etch a stack which includes tantalum silicide. The $SF_6$:$Cl_2$ ratio and other operational parameters are varied to obtain anisotropic etching of the stack or varying degrees of under-etching or excessive lateral etching of the different layers of material. In the examples shown in the '436 patent, some amount of undercutting of the silicide layer occurs. The '436 patent also fails to disclose an etch process by which a sidewall profile with a desired degree of tapering may be obtained without undercutting of the silicide layer.

U.S. Pat. No. 4,443,930, issued Apr. 24, 1984, naming Hwang et al. as inventors, discloses a method of forming a silicon rich metal silicide layer on a doped polysilicon layer or silicon substrate. A plasma etch process involving $CF_4$ and $O_2$ as the etchant gases is described for use in etching a tungsten silicide film ($WSi_2$). The '930 patent describes the $CF_4$:$O_2$ etch chemistry as being highly anisotropic. However, the inventors of the present invention have found that the $CF_4$:$O_2$ etch chemistry causes lateral undercutting of the silicide layer which results in a loss of critical dimension.

U.S. Pat. No. 5,201,993, issued Apr. 13, 1993, naming Langley as inventor, discloses a method for anisotropically etching an oxide/silicide/polysilicon sandwich structure. The etch process consists of two steps: an oxide etch and a polycide etch. The oxide layer is etched by a plasma formed from a mixture of $C_2F_6$, $CF_4$, and $CHF_3$, along with He as a carrier gas. The silicide and polysilicon layers are then etched using a plasma formed from $Cl_2$, again with He as the carrier gas. The '993 patent notes that the production of near vertical etch profiles is assisted by the creation of fluorocarbon polymers which protect the vertical sidewalls from the etching species. The '933 patent notes that the degree of anisotropy of the etch can be varied by altering the ratio of the polymer producing gas (in this case $CHF_3$) to the fluorine producing gas (in this case $CF_4$). However, a disadvantage to this etch method is that variation of the degree of anisotropy is achieved at the cost of a change in the etch rate.

U.S. Pat. No. 4,414,057, issued Nov. 8, 1983, naming Bourassa et al. as inventors, discloses a method for anisotropically etching a stack consisting of a lower dielectric layer, an intermediate polysilicon layer, and an upper silicide layer. The silicide layer is etched using $C_2ClF_5$ in a reactive ion etch process. The polysilicon layer is then etched using a plasma formed from a mixture of chlorine and fluorine, obtained for example from $C_2F_6$ and $Cl_2$.

Finally, "Fabrication of $WSi_x$ Micron Structures Using RIE in $SF_6$—$N_2$ Mixture", C. Meiqiao et al., *Chinese Journal of Semiconductor*, discusses the use of $SF_6$—$N_2$ and $SF_6$—Ar chemistries for use in the reactive ion etching of $WSi_x$. However, the article fails to discuss the etching of polycide structures or certain of the etch parameters needed to ensure reproducibility and control of the etch process, such as the etch endpoints. The article also fails to note the significance of using a chemistry which generates a protective polymer in order to obtain vertical etch profiles.

The art thus discloses several etch chemistries which may be used to etch silicide/polycide films. However, none of the suggested etch chemistries appears to satisfy the need for a highly anisotropic etch which does not produce undercutting of the silicide layer, and in fact may be used to increase the critical dimension of the etched layers. In addition, none of the etch chemistries appears to be capable of being controlled so as to produce a sidewall profile having a desired degree of taper. This is beneficial in forming self-aligned contact structures.

What is desired is a method for anisotropically etching a tungsten silicide or tungsten polycide structure which is highly reproducible and results in minimal undercutting of the silicide film. It is also desired to have an etch method which can be varied to produce a desired degree of sidewall taper. These and other advantages of the present invention will be apparent to those skilled in the art upon a reading of the Detailed Description of the Invention together with the drawings.

SUMMARY OF THE INVENTION

The present invention is directed to a process for anisotropically etching a tungsten silicide or tungsten polycide structure. If the silicide/polycide film has an overlying oxide layer, the insulating layer is removed by a gas mixture composed of $CHF_3$ and $C_2F_6$. The $WSi_x$ silicide layer is then etched in a reactive ion etch using a gas mixture formed from $Cl_2$ and $C_2F_6$, with sufficient $O_2$ added to control polymer formation, thereby preventing undercutting of the silicide. The polysilicon layer is then etched using a gas mixture formed from $Cl_2$ and $C_2F_6$. The optimal gas ratios, RF powers, reactor pressures, and endpoints for the etch steps are also disclosed. The result is a highly anisotropic etch process which preserves the critical dimension of the etched structures. The etch parameters may be varied to produce a tapered sidewall profile for use in the formation of butted contacts without the need for a contact mask.

Further objects and advantages of the present invention will become apparent from the following detailed description and accompanying drawings.

DETAILED DESCRIPTION OF THE INVENTION

Figure 1:
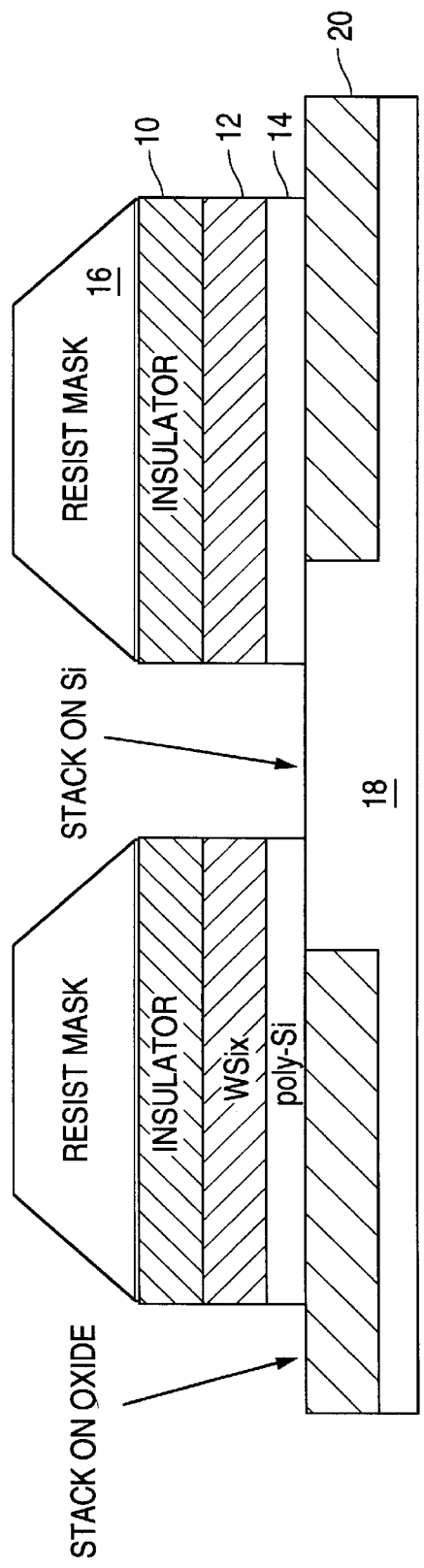
FIG. 1 is a cross-sectional view of an example silicide/polycide structure which is anisotropically etched using the dry etch process of the present invention.

The present invention is a dry etch process for anisotropically etching the silicide/polycide structure shown in FIG. 1. As shown in the figure, the structure to be etched is a multi-layer "sandwich" composed of an insulator layer 10 arranged over a silicide layer 12, which is arranged over a polysilicon layer 14. A layer of resist 16 is typically arranged over insulator layer 10 as part of the process of patterning the silicide/polycide layers. The sandwich structure is formed on a silicon substrate 18, which may have a layer of oxide 20 arranged over it. As is shown in FIG. 1, a portion of the sandwich structure may be arranged over oxide layer 20, while another portion may be arranged over substrate 18.

The goals of the present invention are to provide an etch chemistry and process with the maximum selectivity at each stage, so as to produce a controllable and highly anisotropic etch. It is also desired to have a reproducible etch process having well defined endpoints for each stage of the etch. Additional goals are an etch process which will cause minimal undercutting of the silicide layer (and hence control of the critical dimension), control of the degree of taper of the sidewall structures, and minimal etching of an underlying silicon substrate.

The inventors of the present invention performed the etch process to be described in a LAM 384T Triode etcher, manufactured by LAM Research Corporation, Fremont, Calif. During the etch, all power is applied to the lower electrode of the reactor (the reactive ion etch mode). The temperature of the electrodes was maintained between 15° and 30° C. The etch process of the present invention may be practiced in other reactors as long as they are compatible with the etch chemistry and operating conditions to be described. The gas mixture ratios, RF power, reactor operating pressures, and other operational parameters given were found by the inventors to be optimal for etching the described structure in a manner consistent with the goals of the invention noted. Variations of the parameters given, when used for etching similar structures to those described herein, are intended to be within the scope of the present invention as described in the specification and claims.

The etch process of the present invention includes the following three steps:

1. Insulator Etch (Optional, Used Only if an Insulator Layer is Deposited Over the Silicide)

Insulator layer 10 (typically oxide) is etched using a reactive ion etch process and a gas mixture formed from $CHF_3$ and $C_2F_6$, with He as a wafer backside coolant gas. The optimal $CHF_3:C_2F_6$ ratio for the structure used in testing the inventive etch chemistry was found to be 114:38. For the etch, the RF power is set to 450 watts, the pressure in the reactor is maintained at 130 milli-torr (mT), and the He wafer backside cooling pressure is set to 10 Torr. The optical endpoint of the etch on the silicide layer is achieved with a change in the CO emission at 450±25 nanometers (nm). There is a 30% OE (over-etch) in this step to ensure complete removal of the insulator;

2. Silicide ($WSi_x$) Etch

Silicide layer 12 is etched using a reactive ion etch process and a gas mixture formed from $Cl_2$, $C_2F_6$, and $O_2$. The optimal $Cl_2:C_2F_6:O_2$ ratios were found to be 35:100:20. For the etch, the RF power is set to 400 watts, the pressure in the reactor is maintained at 150 mT, and the He wafer backside cooling pressure is set to 8 Torr. The optical endpoint of the etch on the silicide/polysilicon interface is achieved with a change in the emission at 289±25 nanometers (nm). There is a 20% OE in this step to ensure complete removal of the silicide;

3. Polysilicon Etch

Polysilicon layer 14 (if present) is etched using a reactive ion etch process and a gas mixture formed from $Cl_2$ and $C_2F_6$, with He as a wafer backside coolant gas. The optimal $Cl_2:C_2F_6$ ratio was found to be 50:85. For the etch, the RF power is set to 100 watts, the pressure in the reactor is maintained at 120 mT, and the He wafer backside cooling pressure is set to 8 Torr. The optical endpoint of the etch on the polysilicon/oxide interface in the field oxide region is achieved with a change in the emission at 289±25 nanometers (nm). There is a 20% OE in this step to ensure complete removal of the polysilicon.

If the stack is arranged directly on the silicon without the intermediate field oxide region, then there is no endpoint for the polysilicon etch. However, the sidewall profile will still be acceptable and minimal etching of the silicon substrate will occur.

Using the above etch process, the silicon over etch for the portions of the structure overlying the silicon substrate was found to be less than 1000 Å. The loss of the overlying resist layer for OCG 825 in a typical process was found to be approximately 5000 dÅ.

One of the parameters the inventors investigated was how varying the $C_2F_6:Cl_2$ ratio affected the $WSi_x$ etch. It was found that the etch causes the build up of a polymer on the $WSi_x$, which is bombarded and removed as the etch proceeds. Since the bombardment is anisotropic, the polymer on the sidewalls is not removed and a sloped profile for the sidewall is produced.

As the $C_2F_6:Cl_2$ ratio was decreased, the polymer formation was decreased but the $WSi_x$ and polysilicon etch rates increased at a rapid rate owing to the relative increase in $Cl_2$. As the $C_2F_6:Cl_2$ ratio was increased, the selectivity between the $WSi_x$ and polysilicon etch rates increased, but more polymers formed on the sidewalls producing a sloped sidewall.

However, the inventors determined that addition of $O_2$ to the $C_2F_6/Cl_2$ etch mixture results in a decrease in the polymer formation and produces a highly anisotropic etch resulting in a vertical sidewall. The etch process is sensitive to the amount of $O_2$ added and too much $O_2$ results in excessive side etching of the resist layer, thereby changing the critical dimension and producing an undesired increase of the undercutting of the $WSi_x$ layer.

Adding $O_2$ to the $C_2F_6/Cl_2$ etch gas mixture introduces a control mechanism which allows a desired sidewall profile to be obtained. This is because the $C_2F_6$ component promotes polymer formation, while the $O_2$ suppresses it. Thus, by varying the proportions of $C_2F_6$ and $O_2$ in the etch mixture a desired degree of anisotropy of the etch process may be obtained. This allows the formation of vertical sidewalls or of a sloped (tapered) sidewall having a desired profile. Thus, the $C_2F_6:O_2$ ratio in the silicide layer etch step may be varied to obtain the amount of sidewall taper desired for the intended application.

As noted, the $Cl_2:C_2F_6:O_2$ ratio given above results in an optical endpoint for the etch process at the silicide/polysilicon interface. The endpoint is detected by a change in the emission at wavelengths of 289±25 nanometers, corresponding to channel four on the LAM 384T etcher.

Once the $WSi_x$ has been etched, the etch chemistry needs to be altered to a lower polysilicon etch rate process. This is because the $WSi_x$ etch mixture etches polysilicon too fast for adequate control. A mixture of $Cl_2$ and $C_2F_6$ is used to etch the polysilicon, stopping at the field oxide layer. The operating pressure for this stage is reduced to 120 mT, which was found to improve the uniformity. It is noted that other etch chemistries for polysilicon which are selective to oxide and have an endpoint at the oxide layer could also be used for this stage of the overall etch process. The resist and polymers were found to be completely stripped when the EKC Posistrip 830 solvent strip process (or equivalent) was used in combination with an oxygen plasma strip and piranha clean.

The ability to control the polymer formation when using the etch process of the present invention can also be used to make self-aligned butted contact structures. Since by varying the ratio of $C_2F_6$ to $O_2$ permits the formation of a sidewall with a desired amount of taper, a butted contact between the silicide, polysilicon, and substrate can be formed without the need for a contact mask. This is because the sloped sidewall region permits the deposition of a metal layer which provides electrical contact to each of the layers in the sandwich structure.

Figure 2:
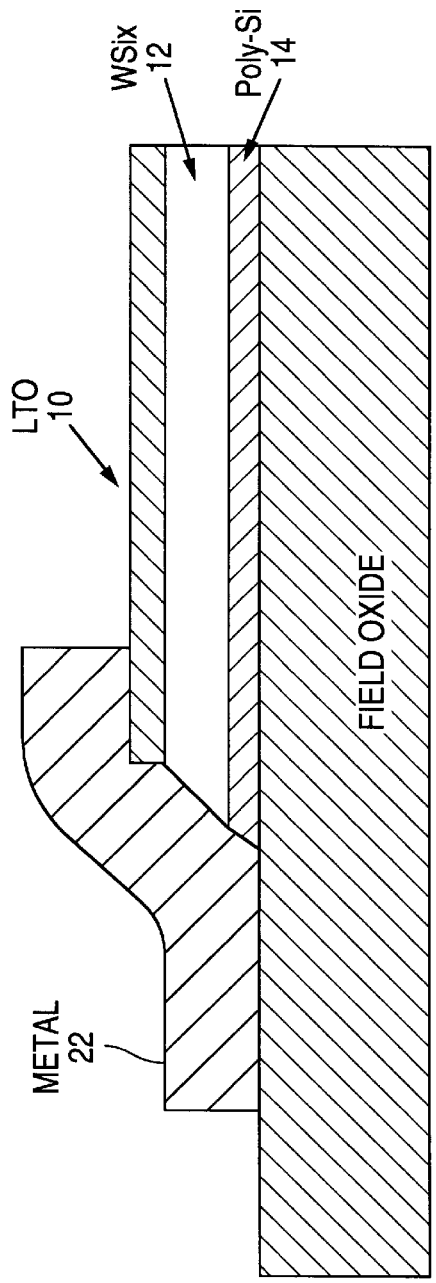
FIG. 2 is a cross-sectional view of a self-aligned butted contact structure which may be formed using the dry etch process of the present invention.

FIG. 2 is a cross-sectional view of a self-aligned butted contact structure which may be formed using the dry etch process of the present invention. As shown in the figure, an insulator 10, silicide 12, polysilicon 14 layered structure is formed on a layer of field oxide 20 which rests on a silicon substrate (not shown). In a variation of the disclosed etch process, the silicide etch is performed with a mixture of $C_2F_6$ and $Cl_2$, without the $O_2$ which was used to obtain the highly anisotropic etch and vertical sidewall profile. This produces an expanding critical dimension etch, in which the polymer formed on the silicide layer is not suppressed or moderated by the $O_2$. The process is sufficient to produce a tapered sidewall profile over which a layer of metal 22 may then be deposited.

The etch process of the present invention, as applied to the formation of a controlled tapered sidewall profile, includes the following three steps:

1. Insulator Etch (Optional, Used Only if an Insulator Layer is Deposited Over the Silicide)

Insulator layer 10 (typically oxide) is etched using a reactive ion etch process and a gas mixture formed from $CHF_3$ and $C_2F_6$, with He as a wafer backside coolant gas. The optimal $CHF_3:C_2F_6$ ratio was found to be 114:38. For the etch, the RF power is set to 450 watts, the pressure in the reactor is maintained at 130 milli-torr (mT), and the He wafer backside cooling pressure is set to 10 Torr. The optical endpoint of the etch on the silicide layer is achieved with a change in the CO emission at 450±25 nanometers (nm). There is a 30% OE in this step to ensure complete removal of the insulator;

2. Silicide ($WSi_x$) Etch

Silicide layer 12 is etched using a reactive ion etch process and a gas mixture formed from $Cl_2$ and $C_2F_6$. The optimal $Cl_2:C_2F_6$ ratio was found to be 35:100. For the etch, the RF power is set to 400 watts, the pressure in the reactor is maintained at 150 mT, and the He wafer backside cooling pressure is set to 8 Torr. The optical endpoint of the etch on the silicide/polysilicon interface is achieved with a change in the CO emission at 289±25 nanometers (nm). There is a 20% in this step to ensure complete removal of the silicide. This etch chemistry is used to produce a tapered sidewall and the relative proportions of the components may be adjusted to control the degree of taper;

3. Polysilicon Etch

Polysilicon layer 14 (if present) is etched using a reactive ion etch process and a gas mixture formed from $Cl_2$ and $C_2F_6$, with He as a wafer backside coolant gas. The optimal $Cl_2:C_2F_6$ ratio was found to be 50:85. For the etch, the RF power is set to 100 watts, the pressure in the reactor is maintained at 120 mT, and the He wafer backside cooling pressure is set to 8 Torr. The optical endpoint of the etch on the polysilicon/oxide interface in the field oxide region is achieved with a change in the CO emission at 289±25 nanometers (nm). There is a 20% OE in this step to ensure complete removal of the polysilicon.

The polysilicon etch is followed by a 30 minute exposure to EKC Posistrip Solvent in Semitool, an oxygen plasma etch for 1 minute, and a 5 minute piranha clean. A layer of metal is then deposited over the tapered structure to complete the self-aligned butted contact.

In addition to permitting the production of sidewalls having a desired degree of taper and the formation of self-aligned butted contacts, the etch process of the present invention may also be used to reduce the opening size of a particular region of a surface beneath the limit of the photolithographic process used to define the opening. For example, the contact opening for a device may be reduced in size so that it is smaller than that defined by the photolithographic process used to form the region. This would be done by first defining the opening using the photolithographic process and then performing the etch process of the present invention on the insulator-silicide (or polycide) stack in a manner which produces outwardly sloped sidewalls on both interior walls of the defined contact region. Referring to FIG. 2, the outwardly sloping sidewall underlying metal layer 22 would be produced on both interior sidewalls of the defined opening, thus extending inwardly into and reducing the size of the opening. This serves to reduce the physical dimensions of the photo-lithographically defined opening.

The etch chemistry of the present invention provides a reproducible method for etching silicide/polycide stacks in order to obtain a highly anisotropic etch. It may also be used to produce a controllable sidewall profile. A combination of a polymer producing gas ($C_2F_6$) and a polymer inhibiting gas ($O_2$) are used to control the degree of sidewall taper and allow the formation of vertical or sloped sidewalls. This permits the etching of the silicide/polycide layers in a manner which preserves the critical dimension. It may also be used to form self-aligned butted contacts or to reduce the size of a feature below that of the photolithographic limit. It is noted that although suggested optimal gas ratios for the structure used in testing the etch process of the present invention are provided, the invention is not limited to such ratios. The etch process may be practiced, and the appended claims are intended to cover, etch processes having the same gases but used in different ratios. This permits the etch rates and selectivity of the etch process steps to be varied as desired.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method of etching a structure which includes a layer of insulator arranged over a layer of silicide, comprising:

etching the insulator layer in a reactive ion etch process using a gas mixture formed from $CHF_3$ and $C_2F_6$; and etching the silicide layer in a reactive ion etch process using a gas mixture formed from $Cl_2$, $C_2F_6$, and $O_2$.

2. The method of claim 1, wherein the structure includes a layer of polysilicon arranged under the layer of silicide, and the method further comprises the step of:

etching the polysilicon layer in a reactive ion etch process using a gas mixture formed from $Cl_2$ and $C_2F_6$.

3. The method of claim of claim 1, wherein the ratio of $CHF_3:C_2F_6$ used in etching the insulator layer is approximately 114:38.

4. The method of claim 1, wherein the ratio of $Cl_2:C_2F_6:O_2$ used in etching the silicide layer is approximately 35:100:20.

5. The method of claim 2, wherein the ratio of $Cl_2:C_2F_6$ used in etching the polysilicon layer is approximately 50:85.

6. The method of claim 1, further comprising the step of:

varying the proportions of $C_2F_6$ and $O_2$ used in etching the silicide layer to produce a tapered sidewall profile.

7. A method of forming a self-aligned butted contact, comprising:

arranging a layer of silicide over a layer of polysilicon;

arranging a layer of insulator over the layer of silicide;

etching the insulator layer in a reactive ion etch process using a gas mixture formed from $CHF_3$ and $C_2F_6$;

etching the silicide layer in a reactive ion etch process using a gas mixture formed from $Cl_2$ and $C_2F_6$, the proportions of $Cl_2$ and $C_2F_6$ being chosen to produce a tapered sidewall profile;

etching the polysilicon layer in a reactive ion etch process using a gas mixture formed from $Cl_2$ and $C_2F_6$; and arranging a layer of metal over the tapered sidewall.

8. The method of claim 7, wherein the ratio of $CHF_3:C_2F_6$ used in etching the insulator layer is approximately 114:38.

9. The method of claim of claim 7, wherein the ratio of $Cl_2:C_2F_6$ used in etching the silicide layer is approximately 35:100.

10. The method of claim of claim 7, wherein the ratio of $Cl_2:C_2F_6$ used in etching the polysilicon layer is approximately 50:85.

11. A method of etching a layer of silicide, comprising:

exposing the silicide layer to a reactive ion etch process using a gas mixture formed from $Cl_2$, $C_2F_6$, and $O_2$.

12. The method of claim of claim 11, wherein the ratio of $Cl_2:C_2F_6:O_2$ used in etching the silicide layer is approximately 35:100:20.

13. The method of claim 11, further comprising the step of:

varying the proportions of $C_2F_6$ and $O_2$ used in etching the silicide layer to produce a tapered sidewall profile.

14. A method of forming an opening having a physical dimension smaller than a limit of a photolithographic process in a structure which includes a layer of insulator arranged over a layer of silicide, comprising:

defining a feature in the structure having a physical dimension equal to the limit of the photographic process;

etching the insulator layer on a sidewall of the defined feature in a reactive ion etch process using a gas mixture formed from $CHF_3$ and $C_2F_6$; and etching the silicide layer on the sidewall in a reactive ion etch process using a gas mixture formed from $Cl_2$, $C_2F_6$, and $O_2$.

15. The method of claim 14, further comprising the step of:

varying the proportions of $C_2F_6$ and $O_2$ used in etching the silicide layer to produce an outwardly tapered sidewall profile, thereby reducing the physical dimension of the feature below that of the limit of the photolithographic process.

* * * * *

UNITED STATES PATENT AND TRADEMARK OFFICE
CERTIFICATE OF CORRECTION

PATENT NO. : 5,856,239
DATED : January 5, 1999
INVENTOR(S) : Rashid Bashir et al.

It is certified that error appears in the above-identified patent and that said Letters Patent is hereby corrected as shown below:

On the cover page, at [75], after "Abul Ehsanul Kabir" insert --, Sunnyvale-- and after "Hebert," delete "both of Sunnyvale," and replace with --, San Mateo,--.

In Col. 7, line 53, delete the second occurrence of "of claim".

In Col. 7, line 56, delete the second occurrence of "of claim".

In Col. 7, line 59, delete the second occurrence of "of claim".

In Col. 8, line 21, delete the second occurrence of "of claim".

In Col. 8, line 24, delete the second occurrence of "of claim".

In Col. 8, line 31, delete the second occurrence of "of claim".

Signed and Sealed this

Thirteenth Day of April, 1999

Attest:

Q. TODD DICKINSON

*Attesting Officer*     *Acting Commissioner of Patents and Trademarks*